US011467328B2

(12) United States Patent
Nagano et al.

(10) Patent No.: US 11,467,328 B2
(45) Date of Patent: Oct. 11, 2022

(54) POLARIZER HAVING NON-POLARIZING PART

(71) Applicant: NITTO DENKO CORPORATION, Ibaraki (JP)

(72) Inventors: Shinobu Nagano, Ibaraki (JP); Masahiro Yaegashi, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 377 days.

(21) Appl. No.: 15/739,531

(22) PCT Filed: Jun. 17, 2016

(86) PCT No.: PCT/JP2016/068134
§ 371 (c)(1),
(2) Date: Dec. 22, 2017

(87) PCT Pub. No.: WO2016/208511
PCT Pub. Date: Dec. 29, 2016

(65) Prior Publication Data
US 2018/0188430 A1 Jul. 5, 2018

(30) Foreign Application Priority Data
Jun. 25, 2015 (JP) .............................. JP2015-127717

(51) Int. Cl.
G02B 5/30 (2006.01)
G02B 1/10 (2015.01)
(Continued)

(52) U.S. Cl.
CPC ............. G02B 5/3025 (2013.01); G02B 1/10 (2013.01); G02B 5/30 (2013.01); G02F 1/133528 (2013.01); G02B 1/04 (2013.01)

(58) Field of Classification Search
CPC .......... G02B 5/30; G02B 5/3025; G02B 1/10; G02B 1/04; G02F 1/133528
(Continued)

(56) References Cited

U.S. PATENT DOCUMENTS 2,409,923 A 10/1946 Barnes
2,647,440 A * 8/1953 Rehorn ................ G02B 5/3033
359/486.02
(Continued)

FOREIGN PATENT DOCUMENTS

CN 101569205 A 10/2009
CN 101925846 A 12/2010
(Continued)

OTHER PUBLICATIONS

Third Party Observation dated Jul. 23, 2018, issued in counterpart Japanese Application No. 2015-127717, with English translation. (12 pages).
(Continued)

Primary Examiner — George G. King
(74) Attorney, Agent, or Firm — WHDA, LLP

(57) ABSTRACT

Provided is a polarizer having a non-polarization portion with reduced shape unevenness. The polarizer of the present invention is a polarizer having a non-polarization portion, in which the non-polarization portion has a shape matching degree of 0.05 or less. In such polarizer, the number of portions where the shape of the non-polarization portion is distorted is small. Accordingly, when the non-polarization portion of the polarizer is used as, for example, a portion corresponding to a camera portion of an image display apparatus, alignment processability is improved and hence the alignment of the camera can be satisfactorily performed.

11 Claims, 3 Drawing Sheets

(51) Int. Cl.
*G02F 1/1335* (2006.01)
*G02B 1/04* (2006.01)

(58) Field of Classification Search
USPC .......... 359/486.01–486.3, 487.01–487.2
See application file for complete search history.

(56) References Cited

U.S. PATENT DOCUMENTS

| | | | |
|---|---|---|---|
| 4,181,756 A | 1/1980 | Fergason | |
| 4,396,646 A | 8/1983 | Schuler et al. | |
| 4,466,704 A | 8/1984 | Schuler et al. | |
| 5,327,285 A * | 7/1994 | Faris | G02B 27/28 |
| | | | 359/486.02 |
| 5,374,477 A | 12/1994 | Lawless et al. | |
| 5,430,566 A | 7/1995 | Sakaya et al. | |
| 5,593,771 A | 1/1997 | Lawless et al. | |
| 5,926,310 A | 7/1999 | Tamura et al. | |
| 6,072,566 A | 6/2000 | Fujii et al. | |
| 6,188,451 B1 | 2/2001 | Fujii et al. | |
| 6,258,429 B1 | 7/2001 | Nelson | |
| 6,606,136 B2 | 8/2003 | Matsumoto et al. | |
| 6,757,102 B2 * | 6/2004 | Nishida | G02B 5/3025 |
| | | | 252/585 |
| 8,101,884 B2 | 1/2012 | Kato et al. | |
| 8,130,293 B2 | 3/2012 | Kanamori et al. | |
| 8,248,558 B2 | 8/2012 | Kimura et al. | |
| 8,259,263 B2 | 9/2012 | Kimura et al. | |
| 8,277,587 B2 | 10/2012 | Kimura et al. | |
| 8,314,987 B2 | 11/2012 | Goto et al. | |
| 8,320,042 B2 | 11/2012 | Goto et al. | |
| 8,379,169 B2 | 2/2013 | Kitagawa et al. | |
| 8,404,334 B2 | 3/2013 | Kimura et al. | |
| 8,411,360 B2 | 4/2013 | Kitagawa et al. | |
| 8,467,177 B2 | 6/2013 | Mathew et al. | |
| 8,491,737 B2 | 7/2013 | Kimura et al. | |
| 8,520,169 B2 | 8/2013 | Kitagawa et al. | |
| 8,520,171 B2 | 8/2013 | Kitagawa et al. | |
| 8,657,976 B2 | 2/2014 | Kimura et al. | |
| 8,709,567 B2 | 4/2014 | Kitagawa et al. | |
| 8,721,816 B2 | 5/2014 | Kitagawa et al. | |
| 8,771,454 B2 | 7/2014 | Goto et al. | |
| 8,852,374 B2 | 10/2014 | Goto et al. | |
| 9,023,168 B2 | 5/2015 | Kitagawa et al. | |
| 9,039,861 B2 | 5/2015 | Yasui et al. | |
| 9,143,668 B2 | 9/2015 | Mathew et al. | |
| 9,169,423 B2 | 10/2015 | Yasui et al. | |
| 9,244,307 B2 | 1/2016 | Hada et al. | |
| 9,283,740 B2 | 3/2016 | Kitagawa et al. | |
| 9,291,744 B2 | 3/2016 | Sawada et al. | |
| 9,329,307 B2 | 5/2016 | Sawada et al. | |
| 9,372,505 B2 | 6/2016 | Mathew et al. | |
| 9,381,534 B2 | 7/2016 | Kim et al. | |
| 9,442,234 B2 | 9/2016 | Kitagawa et al. | |
| 9,442,235 B2 | 9/2016 | Kitagawa et al. | |
| 9,459,390 B2 | 10/2016 | Kitagawa et al. | |
| 9,488,756 B2 | 11/2016 | Yasui et al. | |
| 9,557,450 B2 | 1/2017 | Yasui et al. | |
| 9,618,668 B2 | 4/2017 | Kitagawa et al. | |
| 9,744,750 B2 | 8/2017 | Kitagawa et al. | |
| 9,925,553 B2 | 3/2018 | Kim et al. | |
| 10,009,525 B2 | 6/2018 | Mathew et al. | |
| 10,228,496 B2 | 3/2019 | Yasui et al. | |
| 10,359,553 B2 | 7/2019 | Lee et al. | |
| 10,421,264 B2 | 9/2019 | Kitagawa et al. | |
| 10,429,560 B2 | 10/2019 | Lee et al. | |
| 10,436,960 B2 | 10/2019 | Lee et al. | |
| 10,436,962 B2 | 10/2019 | Lee et al. | |
| 10,754,072 B2 | 8/2020 | Yaegashi et al. | |
| 2002/0071179 A1 | 6/2002 | Maeda et al. | |
| 2004/0212555 A1 | 10/2004 | Falco | |
| 2006/0222813 A1 | 10/2006 | Kato et al. | |
| 2007/0224416 A1 | 9/2007 | Matsubayashi et al. | |
| 2008/0192345 A1 | 8/2008 | Mochizuki et al. | |
| 2009/0136712 A1 | 5/2009 | Sato | |
| 2009/0278954 A1 | 11/2009 | Kanamori et al. | |
| 2010/0032088 A1 | 2/2010 | Kato et al. | |
| 2010/0283943 A1 | 11/2010 | Kimura et al. | |
| 2010/0288420 A1 | 11/2010 | Kimura et al. | |
| 2010/0316817 A1 | 12/2010 | Kimura et al. | |
| 2012/0052197 A1 | 3/2012 | Sawada et al. | |
| 2012/0055607 A1 | 3/2012 | Kitagawa et al. | |
| 2012/0055608 A1 | 3/2012 | Kitagawa et al. | |
| 2012/0055621 A1 | 3/2012 | Goto et al. | |
| 2012/0055622 A1 | 3/2012 | Kitagawa et al. | |
| 2012/0055623 A1 | 3/2012 | Kitagawa et al. | |
| 2012/0056211 A1 | 3/2012 | Kitagawa et al. | |
| 2012/0056340 A1 | 3/2012 | Kitagawa et al. | |
| 2012/0057104 A1 | 3/2012 | Kitagawa et al. | |
| 2012/0057107 A1 | 3/2012 | Kitagawa et al. | |
| 2012/0057231 A1 | 3/2012 | Goto et al. | |
| 2012/0057232 A1 | 3/2012 | Goto et al. | |
| 2012/0058291 A1 | 3/2012 | Kitagawa et al. | |
| 2012/0058321 A1 | 3/2012 | Goto et al. | |
| 2012/0105400 A1 | 5/2012 | Mathew et al. | |
| 2012/0106063 A1 | 5/2012 | Mathew et al. | |
| 2012/0160420 A1 | 6/2012 | Kimura et al. | |
| 2012/0180930 A1 | 7/2012 | Kimura et al. | |
| 2012/0206641 A1 | 8/2012 | Baba | |
| 2012/0211167 A1 | 8/2012 | Kimura et al. | |
| 2012/0216937 A1 | 8/2012 | Kimura et al. | |
| 2012/0300299 A1 | 11/2012 | Yasui et al. | |
| 2013/0017363 A1 | 1/2013 | Morioka et al. | |
| 2013/0100529 A1 | 4/2013 | Kitagawa et al. | |
| 2013/0114139 A1 | 5/2013 | Kitagawa et al. | |
| 2013/0141787 A1 | 6/2013 | Kim et al. | |
| 2013/0160938 A1 | 6/2013 | Yasui et al. | |
| 2013/0216805 A1 | 8/2013 | Yasui et al. | |
| 2013/0265708 A1 | 10/2013 | Mathew et al. | |
| 2014/0016198 A1 | 1/2014 | Sawada et al. | |
| 2014/0044947 A1 | 2/2014 | Sawada et al. | |
| 2014/0118826 A1 | 5/2014 | Jiao et al. | |
| 2014/0130955 A1 | 5/2014 | Yasui et al. | |
| 2014/0186568 A1 | 7/2014 | Kitagawa et al. | |
| 2014/0342129 A1 | 11/2014 | Kim et al. | |
| 2014/0378020 A1 | 12/2014 | Hada et al. | |
| 2015/0158046 A1 | 6/2015 | Kim et al. | |
| 2015/0160390 A1 | 6/2015 | Goyal et al. | |
| 2015/0183199 A1 | 7/2015 | Kitagawa et al. | |
| 2015/0219797 A1 | 8/2015 | Goto et al. | |
| 2016/0025910 A1 | 1/2016 | Sawada et al. | |
| 2016/0054494 A1 | 2/2016 | Kitagawa et al. | |
| 2016/0103258 A1 | 4/2016 | Kitagawa et al. | |
| 2016/0195644 A1 | 7/2016 | Yasui et al. | |
| 2016/0195645 A1 | 7/2016 | Yasui et al. | |
| 2016/0195653 A1 | 7/2016 | Lee et al. | |
| 2016/0195767 A1 | 7/2016 | Lee et al. | |
| 2016/0202403 A1 | 7/2016 | Mathew et al. | |
| 2016/0212311 A1 | 7/2016 | Mathew et al. | |
| 2016/0299271 A1† | 10/2016 | Lee | |
| 2016/0299272 A1 | 10/2016 | Lee et al. | |
| 2016/0313480 A1 | 10/2016 | Lee et al. | |
| 2016/0377777 A1 | 12/2016 | Lee et al. | |
| 2017/0045656 A1 | 2/2017 | Ogomi et al. | |
| 2017/0045657 A1 | 2/2017 | Ogomi et al. | |
| 2017/0052299 A1 | 2/2017 | Ogomi et al. | |
| 2017/0090086 A1 | 3/2017 | Goto et al. | |
| 2017/0090087 A1 | 3/2017 | Goto et al. | |
| 2017/0129197 A1 | 5/2017 | Yaegashi et al. | |
| 2017/0131448 A1 | 5/2017 | Lee et al. | |
| 2017/0131449 A1 | 5/2017 | Yaegashi et al. | |
| 2017/0131451 A1 | 5/2017 | Yaegashi et al. | |
| 2017/0254939 A1 | 9/2017 | Lee et al. | |
| 2018/0173050 A1 | 6/2018 | Yaegashi et al. | |
| 2018/0188421 A1 | 7/2018 | Yasui et al. | |

FOREIGN PATENT DOCUMENTS

| | | |
|---|---|---|
| CN | 102331635 A | 1/2012 |
| CN | 102609038 A | 7/2012 |
| CN | 202394154 U | 8/2012 |
| CN | 105229506 A | 1/2016 |
| CN | 105247395 A | 1/2016 |
| JP | S48-038160 A | 6/1973 |
| JP | 48-64941 A | 9/1973 |

(56) References Cited

FOREIGN PATENT DOCUMENTS

| | | |
|---|---|---|
| JP | 58-49901 A | 3/1983 |
| JP | 58-168019 A | 10/1983 |
| JP | S58-168018 A | 10/1983 |
| JP | S58-168020 A | 10/1983 |
| JP | S59-058419 A | 4/1984 |
| JP | 59-172610 A | 9/1984 |
| JP | 60-133401 A | 7/1985 |
| JP | H08-506867 A | 7/1996 |
| JP | H09-241594 A | 9/1997 |
| JP | H10-90675 A | 4/1998 |
| JP | H10-183390 A | 7/1998 |
| JP | 11-52130 A | 2/1999 |
| JP | 2001-075048 A | 3/2001 |
| JP | 2003-207608 A | 7/2003 |
| JP | 2004-054031 A | 2/2004 |
| JP | 2005-089782 A | 4/2005 |
| JP | 2005-089783 A | 4/2005 |
| JP | 2005-336249 A | 12/2005 |
| JP | 2006-308923 A | 11/2006 |
| JP | 2006-308938 A | 11/2006 |
| JP | 2007-070440 A | 3/2007 |
| JP | 2007-241314 A | 9/2007 |
| JP | 2008-102246 A | 5/2008 |
| JP | 2008-102274 A | 5/2008 |
| JP | 2009-130317 A | 6/2009 |
| JP | 2011-81315 A | 4/2011 |
| JP | 2012-073563 A | 4/2012 |
| JP | 2012-073574 A | 4/2012 |
| JP | 2012-98726 A | 5/2012 |
| JP | 2012-133308 A | 7/2012 |
| JP | 2012-137738 A | 7/2012 |
| JP | 2013-065995 A | 4/2013 |
| JP | 2013-137738 A | 7/2013 |
| JP | 2014-81482 A | 5/2014 |
| JP | 2014-164085 A | 9/2014 |
| JP | 2014-167548 A | 9/2014 |
| JP | 2014167548 A2 † | 9/2014 |
| JP | 2014-211548 A | 11/2014 |
| JP | 2015-215609 A | 12/2015 |
| JP | 2016-525725 A | 8/2016 |
| JP | 2016538599 A | 12/2016 |
| JP | 2017-500606 A | 1/2017 |
| JP | 2017-503193 A | 1/2017 |
| KR | 20050070688 A | 7/2005 |
| KR | 20050085865 A | 8/2005 |
| KR | 10-2009-0107648 A | 10/2009 |
| KR | 10-2009-0129947 A | 12/2009 |
| KR | 20090132406 A | 12/2009 |
| KR | 10-2010-0087837 A | 8/2010 |
| KR | 20100087837 A † | 8/2010 |
| KR | 10-2010-0125537 A | 12/2010 |
| KR | 10-2010-0125558 A | 12/2010 |
| KR | 10-2011-0105803 A | 9/2011 |
| KR | 10-2011-0110889 A | 10/2011 |
| KR | 10-2012-0046035 A | 5/2012 |
| KR | 10-2012-0118205 A | 10/2012 |
| KR | 10-2013-0012026 A | 1/2013 |
| KR | 10-2013-0019001 A | 2/2013 |
| KR | 10-2013-0056323 A | 5/2013 |
| KR | 10-1293210 B1 | 8/2013 |
| KR | 10-2013-0098914 A | 9/2013 |
| KR | 10-2014-0009035 A | 1/2014 |
| KR | 10-2015-0058450 A | 5/2015 |
| KR | 10-2015-0086159 A | 7/2015 |
| KR | 10-2015-0111871 A | 10/2015 |
| KR | 10-2015-0111879 A | 10/2015 |
| KR | 10-2016-0089349 A | 7/2016 |
| KR | 10-1706863 B1 | 2/2017 |
| TW | 200420705 A | 10/2004 |
| TW | 200949321 A | 12/2009 |
| TW | 201028436 A | 8/2010 |
| TW | I333502 B | 11/2010 |
| TW | 201219914 A | 5/2012 |
| TW | 201224716 A | 6/2012 |
| TW | 201307512 A | 2/2013 |
| TW | 201329535 A | 7/2013 |
| TW | 201530199 A | 8/2015 |
| TW | 201602653 A | 1/2016 |
| WO | 2006/095815 A1 | 9/2006 |
| WO | 2008/155873 A1 | 12/2008 |
| WO | 2009/128122 A1 | 10/2009 |
| WO | WO2009128122 * | 10/2009 ....... G02F 1/133528 |
| WO | 2014/065140 A1 | 5/2014 |
| WO | 2015/046969 A1 | 4/2015 |
| WO | 2015/108261 A1 | 7/2015 |
| WO | 2015/147551 A1 | 10/2015 |
| WO | 2015/147552 A1 | 10/2015 |
| WO | 2016/003105 A1 | 1/2016 |

OTHER PUBLICATIONS

International Search Report dated Sep. 20, 2016, issued in counterpart International Application No. PCT/JP2016/068134 (2 pages).
Third Party Observation dated Jul. 18, 2018, issued in counterpart Korean application No. 10-2017-7036920, with English translation. (22 pages).
Office Action dated Oct. 22, 2018, issued in counterpart Korean application No. 10-2017-7036920, with English translation. (12 pages).
Office Action dated Oct. 29, 2019, issued in counterpart TW Application No. 105119990, with English translation. (17 pages).
Office Action dated Aug. 2, 2019. issued in Chinese Patent Application No. 201680037305.7, with English translatior.
Office Action dated May 25, 2016 issued in KR Application No. 20157036668, with English translation.
Office Action dated Jan. 16, 2017 issued in KR Application No. 10-2015-7036599, (Counterpart to U.S. Appl. No. 15/306,362), with English translation.
Office Action dated Jan. 16, 2017 issued in KR Application No. 10-2015-7036600, (Counterpart to U.S. Appl. No. 15/306,316), with English translation.
International Search Report dated Jun. 9, 2015, issued in Application No. PCT/JP2015/062358 (Counterpart to U.S. Appl. No. 15/306,362). (2 pages).
International Search Report dated Jul. 7, 2015, issued in Application No. PCT/JP2015/062359 (Counterpart to U.S. Appl. No. 15/306,316). (2 pages).
Office Action dated Mar. 8, 2017, issued in JP Application No. 2015-087685 (Counterpart to U.S. Appl. No. 15/306,390), with English translation.
Office Action dated Mar. 8, 2017, issued in JP Application No. 2015-087686 (Counterpart to U.S. Appl. No. 15/306,362), with English translation.
Office Action dated Mar. 8, 2017, issued in Japanese Patent Application No. 2015-087687 (Counterpart to U.S. Appl. No. 15/306,316), with English translation.
Non-Final Office Action dated Oct. 20, 2017, issued in U.S. Appl. No. 15/306,362.
International Search Report dated Aug. 11, 2015, issued in counterpart International Application No. PCT/JP2015/068504.
Office Action dated Jan. 17, 2017 issued in KR Application No. 10-2015-7036688, with English translation.
International Search Report dated Aug. 11, 2015, issued in counterpart International Application No. PCT/JP2015/068503.
Korean Report on Prior Art Search issued in Korean Patent Application No. 10-2015-7036634, with English translation.
Office Action dated Mar. 9, 2017 issued in JP Application No. 2015-127641, with English translation.
Office Action dated Mar. 9, 2017 issued in JP Application No. 2015-127642, with English translation.
Office Action dated Mar. 9, 2017 issued in JP Application No. 2015-127644, with English translation.
Non-Final Office Action dated Jun. 1, 2017, issued in U.S. Appl. No. 15/322,258.
International Search Report dated Sep. 8, 2015, issued in counterpart International Application No. PCT/JP2015/068501.
International Search Report dated Aug. 11, 2015, issued in counterpart International Application No. PCT/JP2015/068502.

(56) References Cited

OTHER PUBLICATIONS

Final Office Action dated Nov. 2, 2017, issued in U.S. Appl. No. 15/322,258.
Non-Final Office Action dated Nov. 15, 2017, issued in U.S. Appl. No. 15/321,974.
Office Action dated Dec. 6, 2017, issued in Korean Patent Application No. 10-2015-7036599, (counterpart to U.S. Appl. No. 15/306,362), with English translation.
Non-Final Office Action dated May 17, 2018, issued in U.S. Appl. No. 15/321,875.
Non Final Office Action dated May 31, 2018, issued in U.S. Appl. No. 15/306,316.
Explanation of Circumstances Concerning Accelerated Examination filed on Nov. 21, 2017 issued in JP patent application No. 2015-190040, with English translation.
Explanation of Circumstances Concerning Accelerated Examination filed on Nov. 21, 2017 issued in JP patent application No. 2015-190081, with English translation.
Explanation of Circumstances Concerning Accelerated Examination filed on Nov. 21, 2017 issued in JP patent application No. 2015-190128, with English translation.
Office Action dated Jan. 24, 2018, issued in JP application No. JP2015-190040, with English translation.
Office Action dated Jan. 24, 2018, issued in JP application No. JP2015-190081, with English translation.
Office Action dated Jan. 24, 2018, issued in JP application No. JP2015-190128, with English translation.
Office Action dated Jul. 2, 2018, issued in CN application No. 201580035132.0 (Counterpart to U.S. Appl. No. 15/321,875), with English translation. (24 pages).
Office Action dated Jul. 2, 2018, issued in CN application No. 201580022128.0 (Counterpart to U.S. Appl. No. 15/306,390), with English translation. (22 pages).
Office Action dated May 30, 2018, issued in JP application No. 2015-190081 with English translation (Counterpart to U.S. Appl. No. 15/271,949).
Non-Final Office Action dated Jul. 30, 2018, issued in U.S. Appl. No. 15/271,973.
Office Action dated May 30, 2018, issued in JP application No. 2015-190040, with English translation (Counterpart to U.S. Appl. No. 15/271,891).
Non Final Office Action dated Mar. 30, 2018, issued in U.S. Appl. No. 15/271,973.
Non Final Office Action dated Sep. 7, 2017, issued in U.S. Appl. No. 15/271,973.
Non Final Office Action dated Apr. 20, 2018, issued in U.S. Appl. No. 15/271,949.
Non Final Office Action dated Apr. 16, 2018, issued in U.S. Appl. No. 15/271,891.
Non Final Office Action dated Sep. 13, 2017, issued in U.S. Appl. No. 15/271,891.
Third Party Observation dated Jul. 31, 2018, issued in counterpart JP application No. 2015-127643 (counterpart to U.S. Appl. No. 15/321,875), with English translation. (33 pages).
Office Action dated Aug. 3, 2018, issued in CN application No. 201580022170.2 (Counterpart of U.S. Appl. No. 15/306,316), with English translation. (22 pages).
Office Action dated Aug. 20, 2018, issued in counterpart TW application No. 104113355 (Counterpart of U.S. Appl. No. 15/306,316), with English translation. (23 pages).
Third Party Observation dated Sep. 3, 2018, issued in counterpart JP application No. 2015-190081 (Counterpart of U.S. Appl. No. 15/271,949), with English translation. (24 pages).
Third Party Observation dated Aug. 28, 2018, issued in counterpart JP application No. 2015-190040 (Counterpart of U.S. Appl. No. 15/271,891), with English translation. (25 pages).
Office Action dated Aug. 23, 2018, issued in counterpart TW application No. 104120925 (counterpart to U.S. Appl. No. 15/322,310), with English translation. (49 pages).
Non-Final Office Action dated Nov. 1, 2018, issued in U.S. Appl. No. 15/306,362. (20 pages).
Office Action dated Sep. 28, 2018, issued in TW application No. 104120928 (counterpart to U.S. Appl. No. 15/322,258), with English translation. (9 pages).
Office Action dated Oct. 19, 2018, issued in TW application No. 104113350 (counterpart to U.S. Appl. No. 15/306,362), with English translation. (9 pages).
Third Party Observation discovered Nov. 30, 2018, submitted to the Korean Patent Office on Aug. 23, 2018 for KR application No. 10-2018-7003521, with English translation (counterpart to U.S. Appl. No. 15/306,390)(19 pages).
Office Action dated Dec. 18, 2018, issued in counterpart TW application No. 104120918 (counterpart to U.S. Appl. No. 15/321,875), with English translation. (9 pages).
Office Action dated Apr. 8, 2019, issued in KR application No. 10-2016-0124048 (counterpart to U.S. Appl. No. 15/271,973, with English translation. (11 pages).
Office Action dated May 10, 2019, issued in TW application No. 104113359 (counterpart to U.S. Appl. No. 15/306,390), with English translation. (11 pages).
Non Final Office Action dated Oct. 3, 2019, issued in U.S. Appl. No. 15/306,362. (24 pages).
International Search Report dated Jul. 7, 2015, issued in application No. PCT/JP2015/062357 (counterpart to U.S. Appl. No. 15/306,390), with English translation. (5 pages).
Office Action dated May 18, 2016, issued in KR application No. 10-2015-7036565 (counterpart to U.S. Appl. No. 15/306,390), with English translation. (12 pages).
Korean Prior Art Search (for preferential examination), issued in KR application No. 10-2015-7036565,(counterpart to U.S. Appl. No. 15/306,390), with English translation. (15 pages).
Office Action dated Mar. 20, 2020, issued in TW application No. 105128571 (counterpart to U.S. Appl. No. 15/271,973), with English translation. (14 pages).
Non-Final Office Action dated May 28, 2020, issued in U.S. Appl. No. 15/271,973. (20 pages).
Non-Final dated Nov. 19, 2020, issued in U.S. Appl. No. 15/271,973 (15 pages).
Quayle Action dated Feb. 11, 2022, issued in U.S. Appl. No. 16/935,468 (50 pages).

\* cited by examiner
† cited by third party

POLARIZER HAVING NON-POLARIZING PART

TECHNICAL FIELD

The present invention relates to a polarizer having a non-polarization portion.

BACKGROUND ART

Some of the image display apparatus of a cellular phone, a notebook personal computer (PC), and the like have mounted thereon internal electronic parts, such as a camera. Various investigations have been made for the purpose of improving, for example, the camera performance of any such image display apparatus (for example, Patent Literatures 1 to 7). However, an additional improvement in camera performance or the like has been desired in association with rapid widespread use of a smart phone and a touch panel-type information processing apparatus. In addition, a polarizing plate partially having polarization performance has been required in order to correspond to the diversification of the shapes of the image display apparatus and the high-functionalization thereof. In order to industrially and commercially achieve those requirements, the production of the image display apparatus and/or parts thereof at acceptable cost has been demanded. However, there still remain various items to be investigated for establishing such technology. In, for example, an image display apparatus including a camera, a portion corresponding to the camera is required to be free of polarization performance. When the shape of a portion having partial polarization performance is distorted, an inconvenience may occur in the alignment of the camera.

CITATION LIST

Patent Literature

[PTL 1] JP 2011-81315 A
[PTL 2] JP 2007-241314 A
[PTL 3] US 2004/021-2555 A1
[PTL 4] KR 10-2012-0118205 A
[PTL 5] KR 10-1293210 B1
[PTL 6] JP 2012-137738 A
[PTL 7] JP 2014-211548 A

SUMMARY OF INVENTION

Technical Problem

The present invention has been made to solve the conventional problems, and a primary object of the present invention is to provide a polarizer having a non-polarization portion with reduced shape unevenness.

Solution to Problem

According to one embodiment of the present invention, there is provided a polarizer, including a non-polarization portion, in which the non-polarization portion has a shape matching degree of 0.05 or less.

In one embodiment, the non-polarization portion has a dichromatic substance content of 1.0 wt % or less.

In one embodiment, the non-polarization portion has a content of an alkali metal and/or an alkaline earth metal of 3.6 wt % or less.

In one embodiment, the non-polarization portion corresponds to a camera portion of an image display apparatus on which the polarizer is mounted.

In another embodiment of the present invention, there is provided a polarizing plate. The polarizing plate includes the above-mentioned polarizer.

In still another embodiment of the present invention, there is provided an image display apparatus. The image display apparatus includes the above-mentioned polarizing plate.

Advantageous Effects of Invention

According to the present invention, the polarizer, including a non-polarization portion, in which the non-polarization portion has a shape matching degree of 0.05 or less, can be provided. In such polarizer, the number of portions where the shape of the non-polarization portion is distorted is small. Accordingly, when the non-polarization portion of the polarizer is used as, for example, a portion corresponding to a camera portion of an image display apparatus, alignment processability is improved and hence the alignment of the camera can be satisfactorily performed.

DESCRIPTION OF EMBODIMENTS

Preferred embodiments of the present invention are described below. However, the present invention is not limited to these embodiments.

A. Polarizer

Figure 1:
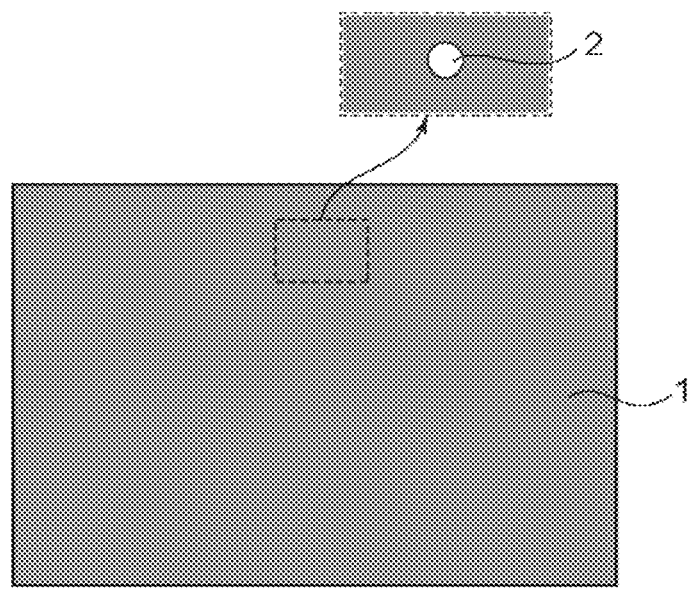
FIG. 1 is a plan view of a polarizer according to one embodiment of the present invention.

FIG. 1 is a plan view of a polarizer according to one embodiment of the present invention. In the polarizer 1, a non-polarization portion 2 is formed. The non-polarization portion 2 is formed by reducing a content of the dichromatic substance including polarizer lower than that of another portion (that is, the portion having polarization performance). According to such construction, a problem in terms of quality, such as cracking, delamination (interlayer peeling), or adhesive protrusion, can be avoided as compared to the case where a hole is formed in the polarizer (specifically by a method involving mechanically punching out the hole through the use of, for example, chisel punching, a plotter, or a water jet). Further, when the content itself of the dichromatic substance in the polarizer is reduced, a reduction in transmittance of the polarizer in association with its use can also be prevented.

In the illustrated example, the non-polarization portion 2 having a small circular shape is formed in a central portion in the upper end portion of the polarizer. However, the arrangement, size, and the like of the non-polarization portion may be appropriately designed. The design is performed in accordance with, for example, the position and size of a camera portion of an image display apparatus on which the polarizer is mounted. Specifically, the design is performed so that the non-polarization portion may not correspond to the display screen of the image display apparatus on which the polarizer is mounted. Examples of the shape of the non-polarization portion include a circular shape, an elliptical shape, a square shape, a rectangular shape, and a diamond shape.

The shape matching degree of the non-polarization portion of the polarizer of the present invention is 0.05 or less, preferably 0.025 or less. The shape matching degree is an indicator representing the degree of the unevenness of the shape of an actually formed non-polarization portion in its radial direction with respect to the outer periphery of a designed non-polarization portion. A shape matching degree of 0.05 or less means that the unevenness of the shape of the actually formed non-polarization portion with respect to the shape of the designed non-polarization portion is reduced, i.e., a polarizer having a non-polarization portion having a shape closer to a desired shape (designed shape) is obtained. For example, when such polarizer is used so that the non-polarization portion of the polarizer may correspond to a camera portion of an image display apparatus, alignment processability is improved and hence the alignment of the camera can be satisfactorily performed. The shape matching degree is more preferably 0. In this description, the shape matching degree is a value calculated by the following method.

Figure 2A:
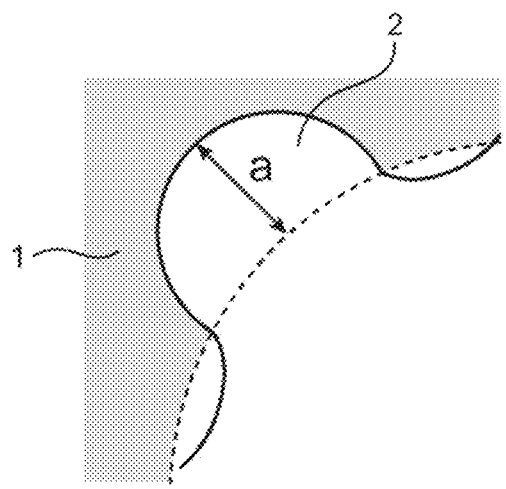
FIG. 2A is a schematic view for illustrating a method of calculating a shape matching degree. A distance a between the outer periphery (solid line) of a designed non-polarization portion and the outer periphery (broken line) of an actually formed non-polarization portion (non-polarization portion approximate circle) in the case where the outer periphery of the designed non-polarization portion is positioned outside the outer periphery of the non-polarization portion approximate circle is illustrated.
Figure 2B:
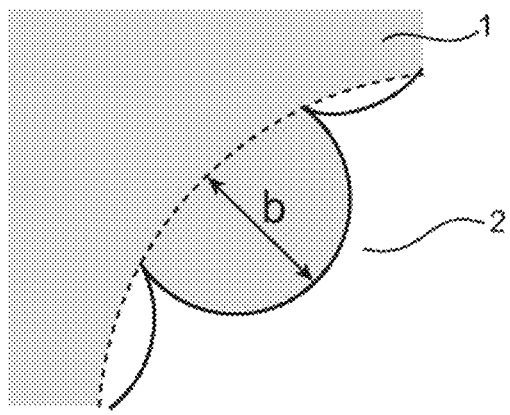
FIG. 2B is a schematic view for illustrating a method of calculating a shape matching degree. A distance b between the outer periphery (solid line) of a designed non-polarization portion, and the outer periphery (broken line) of an actually formed non-polarization portion in the case where the outer periphery or the designed non-polarization portion is positioned inside the outer periphery of the non-polarization portion approximate circle is illustrated.

A method of calculating the shape matching degree is specifically described by taking a case in which the non-polarization portion is a circle as an example. First, the edge detection of the formed non-polarization portion is performed with an image sensor to detect the outer periphery of the formed non-polarization portion (non-polarization portion approximate circle). Here, a boundary between the non-polarization portion and a polarization portion may be positioned outside the outer periphery of the designed non-polarization portion, or may be positioned inside the outer periphery. FIG. 2A and FIG. 2B are each a schematic view for illustrating a relationship between the outer periphery of the designed non-polarization portion and the outer periphery of the actually formed non-polarization portion (non-polarization portion approximate circle). In each of FIG. 2A and FIG. 2B, the outer periphery of the actually formed non-polarization portion is partially represented by a solid line, and the outer periphery of the designed non-polarization portion is partially represented by a broken line. In the case where the outer periphery of the non-polarization portion approximate circle is positioned outside the outer periphery of the designed non-polarization portion (i.e., in the case of FIG. 2A), a distance a between the outer periphery of the designed non-polarization portion and the outer periphery of the non-polarization portion approximate circle is measured. In addition, in the case where the outer periphery of the non-polarization portion approximate circle is positioned inside the outer periphery of the designed non-polarization portion (i.e., in the case of FIG. 2B), a distance b between the outer periphery of the designed non-polarization portion and the outer periphery of the non-polarization portion approximate circle is measured. Thus, the measurement is performed at a total of 180 points every 2° of the central angle of the non-polarization portion approximate circle. The maximum value of the a and the maximum value of the b are each determined from the values measured at the respective points. The total of values obtained by dividing the respective determined maximum values by the diameter of the designed non-polarization portion is defined as the shape matching degree.

Shape matching degree=maximum value of distance a/diameter of designed non-polarization portion+maximum value of distance b/diameter of designed non-polarization portion.

When the non-polarization portion has a shape except a circle, the shape patching degree can be calculated as described below. For example, when the designed non-polarization portion has an elliptical shape, a distance between points of intersection x and x' of a straight line connecting the center of the designed ellipse and the point at which the distance a or b becomes maximum, and the outer periphery of the ellipse can be used instead of the diameter. In addition, when the designed non-polarization portion is a regular polygon, a distance between points of intersection y and y' of a straight line connecting the center of the circumscribed circle of the regular polygon and the point at which the distance a or b becomes maximum, and the outer periphery of the regular polygon can be used.

The polarizer typically includes a resin film containing a dichromatic substance. Examples of the dichromatic substance in the polarizer include iodine and an organic dye. The substances may be used alone or in combination thereof. Of those, iodine is preferably used. This is because of the following reason: as described later, when the polarizer is brought into contact with a basic solution, an iodine complex in the polarizer is reduced to be removed from the polarizer, and as a result, a polarizer having partial polarization performance (polarizer having a non-polarization portion) is satisfactorily obtained.

The non-polarization portion 2 is a portion having a dichromatic substance content smaller than that of the other portion of the polarizer 1 (portion having polarization performance). The content of the dichromatic substance in the non-polarization portion is preferably 1.0 wt % or less, more preferably 0.5 wt % or less, still more preferably 0.2 wt % or less. In addition, a lower limit value for the dichromatic substance content of the non-polarization portion is typically a detection limit value or less. When the dichromatic substance content of the non-polarization portion falls within such range, desired transparency is imparted to the non-polarization portion. In addition, when the non-polarization portion is used as a portion corresponding to a camera of an image display apparatus, photographing performance that is extremely excellent from both the viewpoints of brightness and a tinge can be achieved. When iodine is used as the dichromatic substance, the iodine content of the non-polarization portion refers to a value determined from a calibration curve produced in advance from an X-ray intensity measured by X-ray fluorescence analysis through the use of a standard sample.

A difference between the content of the dichromatic substance in the portion of the polarizer except the non-polarization portion (portion having polarization performance) and the content of the dichromatic substance in the non-polarization portion is preferably 0.5 wt % or more, more preferably 1 wt % or more. When the difference between the content of the dichromatic substance in the portion except the non-polarization portion and the content of the dichromatic substance in the non-polarization portion falls within such range, the non-polarization portion has sufficient transparency, and hence the non-polarization portion can be suitably used as, for example, a portion corresponding to a camera portion of an image display apparatus.

The content of an alkali metal and/or an alkaline earth metal in the non-polarization portion is 3.6 wt % or less, preferably 2.5 wt % or less, more preferably 1.0 wt % or less, still more preferably 0.5 wt % or less. When the content of the alkali metal and/or the alkaline earth metal in the non-polarization portion falls within such range, the shape of the non-polarization portion formed by contact with a basic solution to be described later can be satisfactorily maintained (i.e., a non-polarization portion having excellent dimensional stability can be achieved). The content can be determined from, for example, a calibration curve produced in advance from an X-ray intensity measured by X-ray fluorescence analysis through the use of a standard sample. Such content can be achieved by reducing the amount of the alkali metal and/or the alkaline earth metal in a contact portion in the contact with the basic solution to be described later.

The transmittance of the non-polarization portion (e.g., a transmittance: measured with light having a wavelength of 550 nm at 23° C.) is preferably 50%: or more, more preferably 60% or more, still more preferably 75% or more, particularly preferably 90% or more. With such transmittance, the non-polarization portion has desired transparency. As a result, when the portion is used as a portion corresponding to the camera of an image display apparatus, an adverse effect on the photographing performance of the camera can be prevented.

The polarizer (except the non-polarization portion) preferably shows absorption dichroism in the wavelength range of from 380 nm to 780 nm. The single axis transmittance (Ts) of the polarizer (except the non-polarization portion) is preferably 39% or more, more preferably 39.5% or more, still more preferably 40% or more, particularly preferably 40.5% or more. A theoretical upper limit for the single axis transmittance is 50%, and a practical upper limit therefor is 46%. In addition, the single axis transmittance (Ts) is a Y value measured with the two-degree field of view (C light source) of JIS Z 8701 and subjected to visibility correction, and can be measured with, for example, a microspectroscopic system (manufactured by Lambda Vision Inc., LVmicro). The polarization degree of the polarizer (except the non-polarization portion) is preferably 99.8% or more, more preferably 99.9% or more, still more preferably 99.95% or more.

The thickness of the polarizer (resin film) may be set to any appropriate value. The thickness is preferably 30 µm or less, more preferably 25 µm or less, still more preferably 20 µm or less, particularly preferably less than 10 µm. Meanwhile, the thickness is preferably 0.5 µm or more, more preferably 1 µm or more. With such thickness, the non-polarization portion can be satisfactorily formed by bringing the polarizer into contact with a basic solution. Further, the time period for which the polarizer and the basic solution are in contact with each other can be shortened. In addition, the thickness of a portion brought into contact with the basic solution may be smaller than that of the other portion. When a resin film having a small thickness is used, the difference in thickness between the portion brought into contact with the basic solution and the portion that is out of contact therewith can be reduced, and hence the bonding of the polarizer and any other constituent element, such as a protective film, can be satisfactorily performed.

Any appropriate resin may be used as a material for forming the polarizer. A polyvinyl alcohol-based resin (hereinafter referred to as "PVA-based resin") is preferably used. Examples of the PVA-based resin include polyvinyl alcohol and an ethylene-vinyl alcohol copolymer. The polyvinyl alcohol is obtained by saponifying polyvinyl acetate. The ethylene-vinyl alcohol copolymer is obtained by saponifying an ethylene-vinyl acetate copolymer. The saponification degree of the PVA-based resin is typically 85 mol %: or more and less than 100 mol %, preferably from 95.0 mol % to 99. 95 mol %, more preferably from 99.0 mol % to 99.93 mol %. The saponification degree may be determined in conformity with JIS K 6726-1994. The use of the PVA-based resin having such saponification degree can provide a polarizer excellent in durability. When the saponification degree is too high, there is a risk of gelation.

The average polymerization degree of the PVA-based resin may be appropriately selected depending on purposes. The average polymerization degree is typically from 1,000 to 10,000, preferably from 1,200 to 4,500, more preferably from 1,500 to 4,300. The average polymerization degree may be determined in conformity with JIS K 6726-1994.

In one embodiment, the polarizer is elongated, and has the non-polarization portions each having a shape matching degree of 0.05 or less, the non-polarization portions being arranged at predetermined intervals in its lengthwise direction and/or its widthwise direction (i.e., according to a predetermined pattern). In such polarizer, the positions of the non-polarization portions can be set in accordance with the size of a polarizer that is cut out of the elongated polarizer to be mounted on an image display apparatus and the position of a camera portion of the image display apparatus, and hence a yield at the time of the production of a polarizer having a predetermined size is extremely excellent. Further, the positions of the non-polarization, portions can be accurately set, and hence the position of a non-polarization portion in the polarizer having the predetermined size to be obtained can be satisfactorily controlled. Therefore, a variation in position of a non-polarization portion between the polarizers each having the predetermined size to be obtained becomes smaller, and hence the final products (polarizers each having the predetermined size) free of variation in quality can be obtained. As a result, the polarizers to be obtained can contribute to the multifunctionalization and high-functionalization of an electronic device, such as an image display apparatus.

B. Method of Producing Polarizer

The polarizer of the present invention can be obtained by, for example, bringing, under a state in which a resin film containing a dichromatic substance is covered with a surface protective film so that at least part thereof is exposed, a basic solution into contact with the exposed portion to form the non-polarization portion. In one embodiment, there is used a polarizing film laminate including a resin film containing a dichromatic substance and a surface protective film arranged on one surface side of the resin film, the laminate having, on the one surface side, an exposed portion in which the resin film containing the dichromatic substance is exposed. When the polarizing film laminate having the exposed portion is used, only a desired portion of the polarizer (i.e., a portion exposed from the exposed portion) can be brought into contact with the basic solution. When the polarizer and the basic solution are brought into contact with each other, the content of the dichromatic substance in a contact portion can be reduced, and hence a non-polarization portion having a dichromatic substance content smaller than that of the other portion can be formed.

Figure 3:
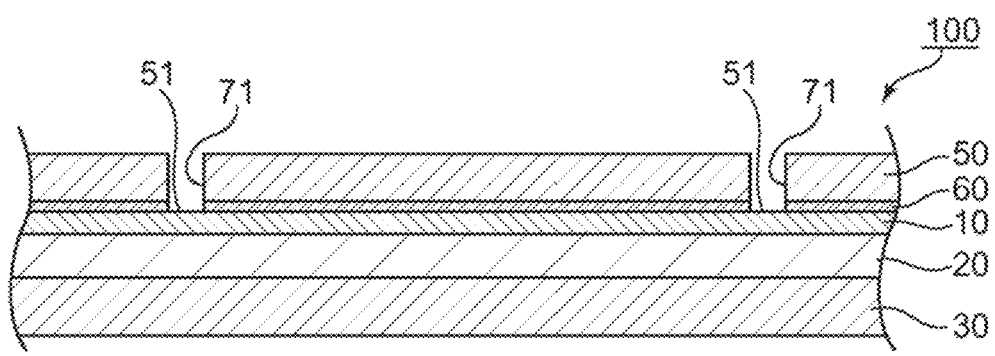
FIG. 3 is a schematic sectional view of a polarizing film laminate to be used in one embodiment of the present invention.

FIG. 3 is a schematic sectional view of a polarizing film laminate to be used in one embodiment of the present invention. In this embodiment, a polarizing plate having a construction "polarizer/protective film" is used. In a polarizing film laminate 100, a surface protective film 50 is laminated on the surface of a polarizer 10 of a laminate of the polarizer 10 and a protective film 20 through intermediation of a pressure-sensitive adhesive layer 60. The surface protective film 50 has through-holes 71. The polarizing film laminate 100 has exposed portions 51 where the polarizer 10 is exposed from the through-holes 71. The surface protective film 50 is peelably laminated on the polarizing plate (substantially, the polarizer 10). Needless to say, the same procedure may be applied to a polarizer having a shape except a polarizing plate shape (e.g., a polarizer that is a single resin film, or a laminate of a resin substrate and a polarizer).

In one embodiment, in the polarizing film laminate 100, another surface protective film (a surface protective film 30 in FIG. 3) may be further laminated on the surface on which the surface protective film 50 having the through-holes is not laminated. The surface protective film 50 having the through-holes is hereinafter sometimes referred to as "first surface protective film," and the surface protective film 30 laminated on the side of the polarizing film laminate 100 on which the surface protective film having the through-holes is not laminated is hereinafter sometimes referred to as "second surface protective film."

B-1-1. Resin Film Containing Dichromatic Substance

The above-mentioned resin film can be used as the resin film containing the dichromatic substance. Iodine is preferably used as the dichromatic substance. This is because of the following reason: as described later, when the resin film is brought into contact with the basic solution, an iodine complex therein is reduced and hence an iodine content therein is reduced, and as a result, a non-polarization portion having appropriate characteristics when used as a portion corresponding to a camera can be formed.

As mentioned above, the resin film containing the dichromatic substance is a film which can function as a polarizer. Specifically, the resin film is subjected to various treatments, such as a swelling treatment, a stretching treatment, a dyeing treatment with the dichromatic substance, a cross-linking treatment, a washing treatment, and a drying treatment, to be brought into a state in which the resin film can function as a polarizer. When the resin film is subjected to the various treatments, the resin film may be a resin layer formed on a substrate. A laminate of the substrate and the resin layer can be obtained by, for example, a method involving applying an application liquid containing a material for forming the resin film to the substrate, or a method involving laminating the resin film on the substrate.

The dyeing treatment is performed by, for example, immersing the resin film in a dyeing liquid. An aqueous solution of iodine is preferably used as the dyeing liquid. The compounding amount of iodine is preferably from 0.04 part by weight to 5.0 parts by weight with respect to 100 parts by weight of water. The aqueous solution of iodine is preferably compounded with an iodide in order that the solubility of iodine in water may be increased. Potassium iodide is preferably used as the iodide. The compounding amount of the iodide is preferably from 0.3 part by weight to 15 parts by weight with respect to 100 parts by weight of water.

In the stretching treatment, typically, the resin film is uniaxially stretched at from 3 times to 7 times. A stretching direction can correspond to the absorption axis direction of the polarizer to be obtained.

The polarizer (resin film) may contain boric acid. Boric acid can be incorporated by bringing a boric acid solution (e.g., an aqueous solution of boric acid) into contact with the polarizer at the time of, for example, the stretching treatment or the cross-linking treatment described above. The boric acid content of the polarizer (resin film) is, for example, from 10 wt % to 30 wt %. In addition, a boric acid content in a portion to be brought into contact with the basic solution to be described later is, for example, from 5 wt % to 12 wt %.

In addition, the resin film may be subjected to any appropriate surface modification treatment. The surface modification treatment may be applied to the entirety of the resin film, or may be applied only to a desired portion thereof (e.g., a portion to be brought into contact with the basic solution). Examples of the surface modification treatment include a corona treatment, a plasma treatment, vacuum UV irradiation, and the application of any appropriate surface modifier.

B-1-2. Surface Protective Film

In the surface protective film 50, the through-holes 71 corresponding to the portions of the polarizer to be obtained that are to be brought into contact with the basic solution (i.e., portions corresponding to the exposed portions 51 of the polarizing film laminate) are arranged.

The through-holes of the surface protective film, can each be formed by, for example, mechanical punching (e.g., punching, chisel punching, a plotter, or a water jet) or the removal of a predetermined portion of the surface protective film (e.g., laser ablation or chemical dissolution).

The surface protective film is preferably a film having a high hardness (e.g., a high modulus of elasticity). This is because of the following reason: the deformation of the through-holes can be prevented, and particularly when the film is used in an elongated polarizing film laminate, the deformation of the through-holes at the time of its conveyance and/or bonding can be prevented. Examples of a formation material for the surface protective film include: ester-based resins, such as a polyethylene terephthalate-based resin; cycloolefin-based resins, such as a norbornene-based resin; olefin-based resins, such as polypropylene; polyamide-based resins; polycarbonate-based resins; and copolymer resins thereof. Of those, ester-based resins (in particular, a polyethylene terephthalate-based resin) are preferred. Any such material has the following advantage: the modulus of elasticity of the surface protective film is so high that the deformation of the through-holes can be prevented, and in the case where the film is used in an elongated polarizing film laminate, the deformation of the through-holes hardly occurs even when tension is applied at the time of its conveyance and/or bonding.

The thickness of the surface protective, film may be set to any appropriate value. For example, the thickness of the surface protective film is from 30 μm to 150 μm because the following advantage is obtained: in the case where the film is used in an elongated polarizing film laminate, the deformation of the through-holes hardly occurs even when tension is applied at the time of its conveyance and/or bonding.

The modulus of elasticity of the surface protective film is preferably from 2.2 kN/mm$^2$ to 4.8 kN/mm$^2$. When the modulus of elasticity of the surface protective film falls within such range, the following advantage is obtained: the deformation of the through-holes can be prevented, and particularly in the case where the film is used in an elongated polarizing film laminate, the deformation of the through-holes hardly occurs even when tension is applied at the time of its conveyance and/or bonding. The modulus of elasticity is measured in conformity with JIS K 6781.

The tensile elongation of the surface protective film is preferably from 90% to 170%. When the tensile elongation of the surface protective film falls within such range, the following advantage is obtained: in the case where the film is used in an elongated polarizing film laminate, the film hardly ruptures during its conveyance. The tensile elongation is measured in conformity with JTS K 67 81.

B-1-3. Pressure-Sensitive Adhesive Layer

The thickness of the pressure-sensitive adhesive layer 60 is preferably 10 μm or less, more preferably 5 μm or less. When the exposed portions are brought into contact with the basic solution by using the polarizing film laminate, the basic solution cannot be sufficiently brought into contact with the exposed portions in some cases owing to the adhesion of air bubbles to the surface protective film and pressure-sensitive adhesive layer of each of the exposed portions. When the sizes of the exposed portions are small or when the shapes of the exposed portions are complicated, the influence of the adhesion of air bubbles becomes remarkable, and hence there is a risk in that a non-polarization portion having a desired shape cannot be formed. When the thickness of the pressure-sensitive adhesive layer falls within such range, the adhesion of air bubbles to the inside of each of the exposed portions due to the surface tension of the pressure-sensitive adhesive of the layer can be prevented. As a result, the basic solution can be sufficiently brought into contact with the exposed portions, and hence a polarizer having a non-polarization portion having a desired shape is obtained.

The pressure-sensitive adhesive layer is formed by using any appropriate composition. The composition for forming a pressure-sensitive adhesive layer contains, for example, a resin component and any appropriate additive. Any appropriate resin may be used as a base resin for the pressure-sensitive adhesive, and a resin having a glass transition temperature Tg of 0° C. or less is preferred. Specific examples thereof include an acrylic resin, a silicone-based resin, a rubber-based resin, and a urethane-based resin. Of those, an acrylic resin is preferred because the state of lamination of the surface protective film and the polarizer can be satisfactorily maintained even when its thickness is 10 μm or less.

The acrylic resin is preferably an acrylic polymer containing at least one kind of acrylate and/or methacrylate (hereinafter sometimes referred to as (meth)acrylate) having an alkyl group having 1 to 14 carbon atoms. The acrylic polymer preferably contains, as a monomer component, 50 wt % to 100 wt % of a (meth) acrylate having an alkyl group having 1 to 14 carbon atoms.

Examples of the (meth)acrylate having an alkyl group having 1 to 14 carbon atoms include methyl (meth)acrylate, ethyl (meth)acrylate, n-butyl (meth)acrylate, t-butyl (meth) acrylate, isobutyl (meth)acrylate, hexyl (meth)acrylate, 2-ethylhexyl (meth)acrylate, n-octyl (meth)acrylate, isooctyl (meth)acrylate, n-nonyl (meth)acrylate, isononyl (meth) acrylate, n-decyl (meth)acrylate, isodecyl (meth)acrylate, n-dodecyl (meth)acrylate, n-tridecyl (meth)acrylate, and n-tetradecyl (meth)acrylate. Those (meth)acrylates may be used alone or in combination thereof.

Of those, a (meth)acrylate having an alkyl group having 4 to 14 carbon atoms, such as butyl (meth)acrylate, hexyl (math)acrylate, 2-ethylhexyl (meth)acrylate, n-octyl (meth) acrylate, isooctyl (meth)acrylate, n-nonyl (meth)acrylate, isononyl (meth)acrylate, n-decyl (meth)acrylate, isodecyl (meth)acrylate, n-dodecyl (meth)acrylate, n-tridecyl (meth) acrylate, of n-tetradecyl (meth)acrylate, is preferably incorporated. When the acrylic resin contains a (meth)acrylate having an alkyl group having 4 to 14 carbon atoms, the control of a pressure-sensitive adhesive strength becomes easy, and hence re-peelability becomes excellent.

The acrylic polymer may contain, in addition to the (meth)acrylate having an alkyl group having 1 to 14 carbon atoms, any appropriate other monomer component. Examples of the other monomer component include: monomer components that can contribute to improvements in aggregation force and heat resistance, such as a sulfonic acid group-containing monomer, a phosphoric acid group-containing monomer, a cyano group-containing monomer, a vinyl ester, and an aromatic vinyl compound; and monomer components each having a functional group capable of improving an adhesive strength or serving as a cross-linking base point, such as a carboxyl group-containing monomer, an acid anhydride group-containing monomer, a hydroxyl group-containing monomer, an amide group-containing monomer, an amino group-containing monomer, an epoxy group-containing monomer, N-acryloylmorpholine, and a vinyl ether. The other monomer components may be used alone or in combination thereof.

Examples of the sulfonic acid group-containing monomer include styrenesulfonic acid, allyl sulfonic acid, 2-(meth) acrylamido-2-methylpropanesulfonic acid, (meth)acrylamidopropanesulfonic acid, sulfopropyl (meth)acrylate, and (meth)acryloyloxynaphthalenesulfonic acid. An example of the phosphoric acid group-containing monomer is 2-hydroxyethyl acryloyl phosphate. An example of the cyano group-containing monomer is acrylonitrile. An example of the vinyl ester is vinyl acetate. An example of the aromatic vinyl compound is styrene.

Examples of the carboxyl group-containing monomer include (meth)acrylic acid, carboxyethyl (meth)acrylate, carboxypentyl (meth)acrylate, itaconic acid, maleic acid, fumaric acid, and crotonic acid. Examples of the acid anhydride group-containing monomer include maleic anhydride and itaconic anhydride. Examples of the hydroxyl group-containing monomer include 2-hydroxyethyl (meth) acrylate, 2-hydroxypropyl (meth)acrylate, 4-hydroxybutyl (meth) acrylate, 6-hydroxyhexyl (meth)acrylate, 8-hydroxyoctyl (meth) acrylate, 10-hydroxydecyl (meth)acrylate, 12-hydroxylauryl (meth)acrylate, (4-hydroxymethylcyclohexyl)methyl acrylate, N-methylol (meth)acrylamide, vinyl alcohol, allyl alcohol, 2-hydroxyethyl vinyl ether, 4-hydroxybutyl vinyl ether, and diethylene glycol monovinyl ether. Examples of the amide group-containing monomer include acrylamide and diethylacrylamide. Examples of the amino group-containing monomer include N,N-dimethylaminoethyl (meth)acrylate and N,N-dimethylaminopropyl (meth)acrylate. Examples of the epoxy group-containing monomer include glycidyl (meth)acrylate and allyl glycidyl ether. An example of the vinyl ether is vinyl ethyl ether.

The other monomer component is used so that the Tg of the polymer to be obtained may be 0° C. or less, for example, because its pressure-sensitive adhesive strength is easily adjusted. The Tg of the polymer is preferably, for example, −100° C. or more.

The weight-average molecular weight of the acrylic polymer is, for example, 100,000 or more.

The acrylic polymer is obtained by any appropriate polymerization method. Examples thereof include polymerization methods to be generally used as approaches to synthesizing the acrylic polymer, such as solution polymerization, emulsion, polymerization, bulk polymerization, and suspension polymerization.

The composition for forming a pressure-sensitive adhesive layer may contain any other resin except the base resin as a resin component. Examples of the other resin include a polyether resin, a modified polyether resin, and an epoxy resin. When the composition contains the other resin, the content of the other resin is preferably 20 wt % or less.

The composition for forming a pressure-sensitive adhesive layer may contain any appropriate additive in addition to the resin component. Examples thereof include a cross-linking agent, a coupling agent, a tackifier, a surface lubricant, a leveling agent, a surfactant, an antistatic agent, a sliding property-improving agent, a wettability-improving agent, an antioxidant, a corrosion inhibitor, a light stabilizer, a UV absorber, a polymerization inhibitor, a cross-linking accelerator, a cross-linking catalyst, an inorganic or organic filler, powders, such as metal powder and a pigment, particles, and a foil-shaped product.

Any appropriate cross-linking agent may be used as the cross-linking agent. Examples thereof include an isocyanate compound, an epoxy compound, an aziridine compound, and a melamine compound. The cross-linking agents may be used alone or in combination thereof.

The content of the cross-linking agent is preferably from 0.1 part by weight to 15 parts by weight, more preferably from 2 parts by weight to 10 parts by weight with respect to 100 parts by weight of the resin component.

The pressure-sensitive adhesive layer may be formed by any appropriate method. Specific examples thereof include a method involving applying the composition for forming a pressure-sensitive adhesive onto the surface protective film and drying, and a method involving forming a pressure-sensitive adhesive layer onto a separator and transferring the pressure-sensitive adhesive layer to the surface protective film. Examples of the application method include a roll coating method, such as reverse coating or gravure coating, a spin coating method, a screen coating method, a fountain coating method, a dipping method, and a spray method.

In one embodiment, the first surface protective film is a pressure-sensitive adhesive sheet including a pressure-sensitive adhesive layer. The first surface protective film in this embodiment is a laminate including a resin film to be used as the above-mentioned surface protective film and a pressure-sensitive adhesive layer arranged on one surface of the resin film, and has a through-hole penetrating the resin film and the pressure-sensitive adhesive layer. When the first surface protective film is a pressure-sensitive adhesive sheet, an elongated polarizer and the first surface protective film that is elongated can be bonded to each other by a roll-to-roll process, and hence the efficiency with which the polarizer is produced can be further improved. In this embodiment, a separator may be peelably temporarily bonded to the pressure-sensitive adhesive layer.

The separator has a function as a protective material configured to protect the pressure-sensitive adhesive layer until the layer is put into practical use. The separator is, for example, a plastic (e.g., polyethylene terephthalate (PET), polyethylene, or polypropylene) film, a non-woven fabric, or paper subjected to surface coating with a release agent, such as a silicone-based release agent, a fluorine-based release agent, or a long-chain alkyl acrylate-based release agent. Any appropriate thickness may be adopted as the thickness of the separator in accordance with purposes. The thickness of the separator is, for example, from 10 μm to 100 μm. The separator may be laminated on the laminate of the resin film to be used as the above-mentioned surface protective film and the pressure-sensitive adhesive layer. Alternatively, the following may be performed: the pressure-sensitive adhesive layer is formed on the separator, and a laminate of the separator and the pressure-sensitive adhesive layer is laminated on the resin film to be used as the surface protective film.

As described above, in the polarizing film laminate 100, a second surface protective film 30 may be further laminated on a side on which the first surface protective film 50 is not arranged. The same film as the first surface protective film 50 except that no through-holes are arranged may be used as the second surface protective film. Further, a soft (e.g., low-modulus of elasticity) film, such as a polyolefin (e.g., polyethylene) film, can also be used as the second surface protective film. When the second surface protective film is used, the polarizing plate (polarizer/protective film) can be more appropriately protected in a step of bringing the polarizer into contact with the basic solution, and as a result, the step of bringing the polarizer and the basic solution into contact with each other can be more satisfactorily performed.

B-2. Step of Bringing Resin Film into Contact with Basic Solution

Next, the basic solution is brought into contact with the resin film. The basic solution is brought into contact with, for example, the exposed portions of the polarizing film laminate. When the basic solution is brought into contact with the exposed portions, the content of the dichromatic substance of each of the exposed portions is reduced, and the non-polarization portions can be formed by the reduction in content of the dichromatic substance. As described above, a polarizer containing iodine is preferred as the polarizer to be used in the polarizing film laminate. When the polarizer contains iodine as the dichromatic substance, the iodine content of the exposed portion of the polarizer is reduced by bringing the basic solution into contact with the exposed portion, and as a result, the non-polarization portion can be selectively formed only in the exposed portion. Accordingly, the non-polarization portion can be selectively formed in a predetermined portion of the polarizer with extremely high production efficiency without any complicated operation. In the case where iodine remains in the polarizer, even when the non-polarization portion is formed by breaking an iodine complex, there is a risk in that the iodine complex is formed again in association with the use of the polarizer, and hence the non-polarization portion does not have desired characteristics. In the present invention, iodine itself is removed from the polarizer (substantially, the non-polarization portions). As a result, changes in characteristics of the non-polarization portions in association with the use of the polarizer can be prevented.

The step of bringing the basic solution into contact with the resin film may be performed by any appropriate means. Examples thereof include immersion, dropping, application, and spraying. As described above, when the first surface protective film (and, as required, the second surface protective film) is used, the content of iodine in the polarizer does not reduce in a portion except the exposed portions of the polarizing film laminate, and hence the non-polarization portions can be formed only in desired portions by the immersion. Specifically, when the polarizing film laminate is immersed in the basic solution, only the exposed portions in the polarizing film laminate are brought into contact with the basic solution.

The formation of the non-polarization portion with the basic solution is described in more detail. After having been brought into contact with the exposed portion of the polarizing film laminate, the basic solution permeates the inside of the exposed portion (specifically the polarizer). The iodine complex in the polarizer is reduced by a base in the basic solution to become an iodine ion. When the iodine complex is reduced to the iodine ion, the polarization performance of the polarizer exposed from the exposed portion substantially disappears and hence the non-polarization portion is formed in the exposed portion. In addition, the reduction of the iodine complex increases the transmittance of the exposed portion. Iodine that has become the iodine ion moves from the exposed portion to the solvent of the basic solution. As a result, the iodine ion is removed from the polarizer together with the basic solution. Thus, the non-polarization portion is selectively formed in a predetermined portion of the polarizer, and the non-polarization portion becomes stable without any change with time. The permeation of the basic solution up to an undesired portion (as a result, the formation of the non-polarization portion in the undesired portion) can be prevented by adjusting, for example, a material for, and the thickness and mechanical characteristics of, the first surface, protective film, the concentration of the basic solution, and the immersion time of the polarizing film laminate into the basic solution.

Any appropriate basic compound may be used as the basic compound in the basic solution. Examples of basic compounds ioniinclude: hydroxides of alkali metals, such as sodium hydroxide, potassium hydroxide, and lithium hydroxide; hydroxides of alkaline earth metals, such as calcium hydroxide; inorganic alkali metal salts, such as sodium carbonate; organic alkali metal salts, such as sodium acetate; and ammonia water. Of those basic compounds in the basic solution, hydroxides of alkali metals are preferred, and sodium hydroxide, potassium hydroxide, and lithium hydroxide are more preferred. The use of a basic solution containing a hydroxide of an alkali metal can efficiently ionize the iodine complex, and hence more simply forms a non-polarization portion. Those basic compounds may be used alone or in combination.

Any appropriate solvent may be used as the solvent of the basic solution. Specific examples thereof include water, alcohols, such as ethanol and methanol, ethers, benzene, chloroform, and mixed, solvents thereof. The solvent is preferably water or an alcohol because the iodine ion can satisfactorily migrate to the solvent and can be easily removed.

The concentration of the basic solution is, for example, from 0.01 N to 5 N, preferably from 0.05 N to 3 N, more preferably from 0.1 N to 2.5 N. When the concentration of the basic solution falls within such range, the content, of iodine in the polarizer can be efficiently reduced, and the ionization of the iodine complex in a portion except the exposed portion can be prevented.

The liquid temperature of the basic solution is, for example, from 20° C. to 50° C. The time period for which the polarizing film laminate (substantially the exposed portion of the polarizer) and the basic solution are brought into contact with each other may be set in accordance with the thickness of the polarizer, the kind of the basic compound in the basic solution to be used, and the concentration of the basic compound, and is, for example, from 5 seconds to 30 minutes.

B-3. Reduction of Amount of Alkali Metal and/or Alkaline Earth Metal

After the contact with the basic solution, the amount of an alkali metal and/or an alkaline earth metal in the resin film is reduced in the contact portion with which the basic solution has been brought into contact. The reduction of the amount of the alkali metal and/or the alkaline earth metal can provide a non-polarization portion excellent in dimensional stability. Specifically, the shapes of the non-polarizationportions formed by the contact with the basic solution can be maintained as they are even under a humidified environment.

When the basic solution is brought into contact with the resin film, a hydroxide of the alkali metal and/or the alkaline earth metal may remain in the contact portion. In addition, when the basic solution is brought into contact with the resin film, a metal salt of the alkali metal and/or the alkaline earth metal may be produced in the contact portion. Any such metal salt may produce a hydroxide ion, and the produced hydroxide ion may act on (decompose or reduce) the dichromatic substance (e.g., an iodine complex) present around the contact portion to expand a non-polarizing region (low concentration region). Therefore, it is assumed that the reduction in content of the alkali metal salt and/or the alkaline earth metal salt suppresses temporal expansion of the non-polarizing region and hence enables the maintenance of a desired shape of the non-polarization portion.

The metal salt that may produce a hydroxide ion is, for example, a borate. The borate may be produced by the neutralization of boric acid in the resin film with the basic solution (a solution of a hydroxide of an alkali metal and/or a hydroxide of an alkaline earth metal. For example, when the polarizer is placed under a humidified environment, the borate (metaborate) may be hydrolyzed to produce a hydroxide ion as represented by the following formulae.

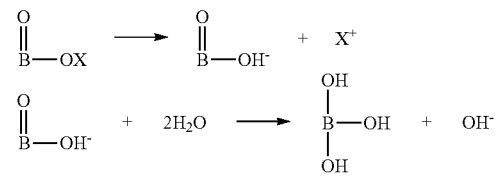

(In the formulae, X represents an alkali metal or an alkaline earth metal),

The content of the alkali metal and/or the alkaline earth metal in the contact portion (non-polarization portion) is preferably reduced so as to be 3.6 wt. % or less, and is reduced so as to be preferably 2.5 wt % or less, more preferably 1.0 wt % or less, still more preferably 0.5 wt. % or less.

The alkali metal and/or the alkaline earth metal may be incorporated into the resin film in advance by subjecting the film to the various treatments for turning the film into a polarizer. For example, the potassium may be incorporated into the resin film by bringing a solution of an iodide, such as potassium iodide, into contact with the film. The alkali metal and/or the alkaline earth metal to be typically incorporated into the polarizer may not adversely affect the dimensional stability of the non-polarization portion.

A method involving bringing a treatment liquid into contact with the contact portion with the basic solution is preferably used as the method for the reduction. According to such method, the alkali metal and/or the alkaline earth metal is caused to migrate from the resin film toward the treatment liquid, and hence the content thereof can be reduced.

Any appropriate method may be adopted as a method for the contact of the treatment liquid. Examples thereof include: a method involving dropping, applying, or spraying the treatment liquid onto the contact portion with the basic solution; and a method involving immersing the contact portion with the basic solution in the treatment liquid.

In the case where the resin film is protected with any appropriate protective material (for example, above mentioned surface protect film) at the time of the contact of the basic solution, the treatment liquid is preferably brought into contact as it is with the contact portion (particularly when the temperature of the treatment liquid is 50° C. or more). According to such mode, reductions in polarization characteristics by the treatment liquid, can be prevented in a portion except the contact portion with the basic solution.

The treatment liquid may contain any appropriate solvent. Examples of the solvent include water, alcohols, such as ethanol and methanol, ethers, benzene, chloroform, and mixed solvents thereof. Of those, water or an alcohol is preferably used from the viewpoint of efficiently causing the alkali metal and/or the alkaline earth metal to migrate. Any appropriate water may be used as the water. Examples thereof include tap water, pure water, and deionized water.

The temperature of the treatment liquid at the time of its contact is, for example, 20° C. or more, preferably 50° C. or more, more preferably 60° C. or more, still more preferably 70° C. or more. With such temperature, the alkali metal and/or the alkaline earth metal can be efficiently caused to migrate toward the treatment liquid. Specifically, the swelling ratio of the resin film is significantly increased, and hence the alkali metal and/or the alkaline earth metal in the resin film can be physically removed. Meanwhile, the temperature of the water is substantially 95° C. or less.

A contact time can be appropriately adjusted in accordance with, for example, a method for the contact and temperature of the treatment liquid (water), and the thickness of the resin film. For example, when the resin film is immersed in warm water, the contact time is preferably from 10 seconds to 30 minutes, more, preferably from 30 seconds to 15 minutes, still more preferably from 60 seconds to 10 minutes.

In one embodiment, an acidic solution is used as the treatment liquid. The use of the acidic solution can neutralize the hydroxide of the alkali metal and/or the alkaline earth metal remaining in the resin film to chemically remove the alkali metal and/or the alkaline earth metal in the resin film.

Any appropriate acidic compound may be used as an acidic compound in the acidic solution. Examples, of the acidic compound include: inorganic acids, such as hydrochloric acid, sulfuric acid, nitric acid, hydrogen fluoride, and boric acid; and organic acids, such as formic acid, oxalic acid, citric acid, acetic acid, and benzoic acid. The acidic compound in the acidic solution is preferably an inorganic acid, more preferably hydrochloric acid, sulfuric acid, or nitric acid. One kind of those acidic compounds may be used alone, or two or more kinds thereof may be used in combination.

An acidic compound having an acidity stronger than that of boric acid is preferably used as the acidic compound. This is because the compound can also act on the metal salt (borate) of the alkali metal and/or the alkaline earth metal. Specifically, the compound can liberate boric acid from any such borate to chemically remove the alkali metal and/or the alkaline earth metal in the resin film.

An indicator of the acidity is, for example, an acid dissociation constant (pKa), and an acidic compound having a pKa smaller than the pKa of boric acid (9.2) is preferably used. Specifically, the pKa is preferably less than 9.2, more preferably 5 or less. The pKa may be measured with any appropriate measuring apparatus, and reference may be made to a value disclosed in a literature, such as "Handbook of Chemistry: Pure Chemistry, 5th ed." (edited by The Chemical Society of Japan, Maruzen Publishing Co., Ltd.). In addition, in the case of an acidic compound that dissociates in a multi-stages, its pKa value may change in each stage. When such acidic compound is used, such a compound that any one of the pKa values in the respective stages fails within the range is used. The pKa as used herein refers to a value in an aqueous solution at 25° C.

A difference between the pKa of the acidic compound and the pKa of boric acid is, for example, 2.0 or more, preferably from 2.5 to 15, more preferably from 2.5 to 13. When the difference fall within such range, the alkali metal and/or the alkaline earth metal can be efficiently caused to migrate toward the treatment liquid.

Examples of the acidic compound that may satisfy the pKa include, for example: inorganic acids, such as hydrochloric acid (pKa: −3.7), sulfuric acid ($pK_2$.1.96), nitric acid (pKa: −1.8), hydrogen fluoride (pKa: 3.17), boric acid (Pka: 9.2); and organic acids, such as formic acid (pKa: 3.54), oxalic acid ($pK_1$: 1.04, $pK_2$: 3.82), citric acid ($pK_1$: 3.09, $pK_2$.4.75, $pK_3$.6.41), acetic acid (pKa: 4.8), and benzoic acid (pKa: 4.0) and the like.

The solvent of the acidic solution (treatment liquid) is as described above, and also in this mode in which the acidic solution is used as the treatment liquid, the physical removal of the alkali metal and/or the alkaline earth metal in the resin film may occur.

The concentration of the acidic: solution is, for example, from 0.01 N to 5 N, preferably from 0.05 N to 3 N, more preferably from 0.1 N to 2.5 N.

The liquid temperature of the acidic solution is, for example, from 20° C. to 58° C. The time period for which the resin film and the acidic solution are brought into contact with each other can be set in accordance with the thickness of the resin film, the kind of the acidic compound, and the concentration of the acidic solution. The contact time is, for example, from 5 seconds to 30 minutes.

The resin film may be subjected to any appropriate other treatment. An example of the other treatment is the removal of the basic solution and/or acidic solution and washing treatment and the like.

A method of removing the basic solution and/or acidic solution is specifically, for example, removal by wiping with waste cloth or the like, suction removal, natural drying, heat drying, blow drying, or drying under reduced pressure. The drying temperature is, for example, from 20° C. to 100° C. The drying time is, for example, 5 seconds to 600 seconds.

A washing treatment is performed any appropriate method. A solution to be used in the washing treatment is, for example, pure water, an alcohol, such as methanol or ethanol, an acidic solution or a mixed liquid thereof. The washing treatment may be performed any appropriate stage, and the washing treatment may be performed a plurality of times.

C. Polarizing Plate

The polarizer may be practically provided as a polarizing plate. The polarizing plate has the polarizer and a protective film arranged on at least one side of the polarizer. Practically, the polarizing plate has a pressure-sensitive adhesive layer as an outermost layer. The pressure-sensitive adhesive layer typically serves as an outermost layer on an image display apparatus side. A separator may be peelably temporarily bonded to the pressure-sensitive adhesive layer.

As formation materials for the protective film, there are given, for example, a cellulose-based resin, such as diacetyl cellulose or triacetyl cellulose, a (meth)acrylic resin, a cycloolefin-based resin, an olefin-based resin, such as polypropylene, an ester-based resin, such as a polyethylene terephthalate-based resin, a polyamide-based resin, a polycarbonate-based resin, and copolymer resins thereof. The thickness of the protective film is preferably from 20 μm to 100 μm. The protective film is typically laminated on the polarizer through intermediation of an adhesion layer (specifically an adhesive layer or a pressure-sensitive adhesive layer). The adhesive layer is typically formed of a PVA-based adhesive or an active energy ray-curable adhesive. The pressure-sensitive adhesive layer is typically formed of an acrylic pressure-sensitive adhesive The polarizing plate may further have any appropriate optical functional layer in accordance with purposes. Typical examples of the optical functional layer include a retardation film (optical compensation film) and a surface-treated layer. For example, the retardation film may be arranged between the protective film and the pressure-sensitive adhesive layer. The optical characteristics (e.g., a refractive index ellipsoid, an in-plane retardation, and a thickness direction retardation) of the retardation film may be appropriately set in accordance with, for example, purposes and the characteristics of the image display apparatus. For example, when the image display apparatus is an IPS-mode liquid crystal display apparatus, a retardation film having a refractive index ellipsoid of nx>ny>nz and a retardation film having a refractive index ellipsoid of nz>nx>ny may be arranged. The retardation film may also serve as the protective film. In this case, the protective film may be omitted. In contrast, the protective film may have an optical compensation function (i.e., may have an appropriate refractive index ellipsoid, an appropriate in-plane retardation, and an appropriate thickness direction retardation in accordance with purposes). The symbol "nx" represents a refractive index in the direction in which a refractive index in a film surface becomes maximum (i.e., a slow axis direction), the symbol "ny" represents a refractive index in a direction perpendicular to the slow axis in the film surface, and the symbol "nz" represents a refractive index in a thickness direction.

The surface-treated layer may be arranged on the viewer side of the polarizing plate. Typical examples of the surface-treated layer include a hard coat layer, an antireflection layer, and an antiglare layer. The surface-treated layer is preferably, for example, a layer having a low moisture permeability for the purpose of improving the humidification durability of the polarizer. The hard coat layer is arranged for the purpose of, for example, preventing the surface of the polarizing plate from being flawed. The hard coat layer can be formed by, for example, a system involving adding, to the surface, a cured coating film based on an appropriate UV-curable resin, such as an acrylic UV-curable resin or a silicone-based UV-curable resin, the cured coating film being excellent in hardness, sliding characteristic, and the like. The hard coat, layer preferably has a pencil hardness of 2H or more. The antireflection layer is a low-reflection layer arranged for the purpose of preventing the reflection of ambient light on the surface of the polarizing plate. Examples of the type of the antireflection layer include: such a thin-layer type as disclosed in JP 2005-248173 A configured to prevent the reflection through the utilization of a reflected light-canceling effect exhibited by an optical interferential action; and such a surface structure type as disclosed in JP 2011-2759 A configured to impart a fine structure to the surface to express a low reflectance. The antiglare layer is arranged for the purpose of, for example, preventing the inhibition of the viewing of light transmitted through the polarizing plate due to the reflection of the ambient light on the surface of the polarizing plate. The antiglare layer is formed by, for example, imparting a fine uneven structure to the surface according to an appropriate system, such as a surface-roughening system based on a sandblast system or an embossing system, or a system involving compounding transparent fine particles. The antiglare layer may also serve as a diffusion layer (e.g., a viewing angle-broadening function) for diffusing the light transmitted through the polarizing plate to broaden a viewing angle or the like. The surface of the protective film on the viewer side may be subjected to the same surface treatment instead of the arrangement of the surface-treated layer.

D. Image Display Apparatus

An image display apparatus of the present invention includes the polarizing plate. Examples of the image display apparatus include a liquid crystal display apparatus and an organic EL device. Specifically, the liquid crystal display apparatus includes a liquid crystal panel including: a liquid crystal cell; and the polarizer arranged on one side, or each of both sides, of the liquid crystal cell. The organic EL device includes an organic EL panel including the polarizer arranged on a viewer side. The polarizer is arranged so that its non-polarization portion may correspond to the camera portion of an image display apparatus on which the polarizer is mounted.

EXAMPLES

Now, the present invention is specifically described by way of Examples. However, the present invention is not limited to these Examples.

Example 1

An acrylic pressure-sensitive adhesive was applied to an elongated (width: 1,200 mm, length: 43 m) PET film having a thickness of 38 μm (manufactured by Mitsubishi Polyester Film, Inc., product name: DIAFOIL T100C) so that its thickness after drying became 10 μm. Thus, a pressure-sensitive adhesive layer was formed. A separator was bonded to the formed pressure-sensitive adhesive layer. Thus, a pressure-sensitive adhesive sheet was obtained. 1,000 Circular small holes were formed in the resultant pressure-sensitive adhesive sheet with a pinnacle blade. The respective small holes were formed at intervals of 250 mm in the longitudinal direction of the sheet and 400 mm in the lateral direction thereof. Circular-small holes each having a diameter of 2 mm were formed.

An amorphous isophthalic acid-copolymerized polyethylene terephthalate (IPA-copolymerized PET) film of an elongated shape (thickness: 100 μm) having a water absorption ratio of 0.75% and a Tg of: 75° C. was used as a substrate. One surface of the substrate was subjected to a corona treatment, and an aqueous solution containing polyvinyl alcohol (polymerization degree: 4,200, saponification degree: S99.2 mol %) and acetoacetyl-modified PVA (polymerization degree: 1,200, acetoacetyl modification degree: 4.6%, saponification degree: 99.0 mol % or more, manufactured by The Nippon Synthetic Chemical Industry Co., Ltd., product name: "GOHSEFIMER Z-200") at a ratio of 9:1 was applied to the corona-treated surface and dried at 25° C. to form a FVA-based resin layer having a thickness of 11 μm. Thus, a laminate was produced.

The resultant laminate was subjected to free-end uniaxial stretching in an oven at 120° C. between rolls having different peripheral speeds in a longitudinal direction (lengthwise direction) at 2.0 times (in-air auxiliary stretching).

Next, the laminate was immersed in an insolubilizing bath having a liquid temperature of 30° C. (an aqueous solution of boric acid obtained by compounding 100 parts by weight of water with 4 parts by weight of boric acid) for 30 seconds (insolubilizing treatment).

Next, the laminate was immersed in a dyeing bath having a liquid temperature of 30° C. while an iodine concentration and an immersion time were adjusted so that a polarizing plate to be obtained had a predetermined transmittance. In this example, the laminate was immersed in an aqueous solution of iodine, which was obtained by compounding 100 parts by weight of water with 0.2 part by weight of iodine and 1.5 parts by weight of potassium iodide, for 60 seconds (dyeing treatment).

Next, the laminate was immersed in a cross-linking bath having a liquid temperature of 30° C. (an aqueous solution of boric acid obtained by compounding 100 parts by weight of water with 3 parts by weight of potassium iodide and 3 parts by weight of boric acid) for 30 seconds (cross-linking treatment).

After that, the laminate was subjected touniaxial stretching between rolls having different peripheral speeds in a longitudinal direction (lengthwise direction) so: that a total stretching ratio became 5.5 times while being immersed in an aqueous solution of boric acid having a liquid temperature of 70° C. (an aqueous solution obtained by compounding 100 parts by weight of water with 4 parts by weight of boric acid and 5 parts by weight of potassium iodide) (underwater stretching).

After that, the laminate was immersed in a washing bath having a liquid temperature of 30° C. (an aqueous solution obtained by compounding 100 parts by weight of water with 4 parts by weight of potassium iodide) (washing treatment).

Subsequently, a PVA-based resin aqueous solution (manufactured by The Nippon Synthetic Chemical Industry Co., Ltd., product name: "GOHSEFIMER (trademark) Z-200", resin concentration: 3 wt %) was applied to the PVA-based resin layer surface of the laminate, and a protective film (thickness: 25 μm) was bonded thereto, followed by the heating of the resultant in an oven maintained at 60° C. for 5 minutes. After that, the substrate was peeled from the PVA-based resin layer. Thus, a polarizing plate including a polarizer having a transmittance of 42.3% and a thickness of 5 μm (width: 1,200 mm, length: 400 m) was obtained.

Next, the pressure-sensitive adhesive sheet from which the separator had been peeled was bonded to the surface of the resultant polarizing plate on a polarizer side through intermediation of the pressure-sensitive adhesive layer. Thus, a laminate was obtained. The resultant laminate was immersed in a basic solution at normal temperature (aqueous solution of sodium hydroxide, 1 mol/L (1 N)) for 8 seconds and in a 0.1 mol/L (0.1 N) hydrochloric acid for 30 seconds. After that, the resultant was dried at 60° C. and the PET film was peeled. Thus, a polarizing plate including a polarizer having transparent portions was obtained.

Example 2

A polarizing plate including a polarizer having transparent portions was obtained in the same manner as in Example 1 except that the thickness of the pressure-sensitive adhesive layer was set to 5 μm.

Comparative Example 1

A polarizing plate including a polarizer having transparent portions was obtained in the same manner as in Example 1 except that the thickness of the pressure-sensitive adhesive layer was set to 30 μm.

Comparative Example 2

A polarizing plate including a polarizer having transparent portions was obtained in the same manner as in Example 1 except that the thickness of the pressure-sensitive adhesive layer was set to 20 μm.

Comparative Example 3

A polarizing plate including a polarizer having transparent portions was obtained in the same manner as in Example 1 except that the thickness of the pressure-sensitive adhesive layer was set to 15 μm.

Example 3

A polarizing plate including a polarizer having transparent portions was obtained in the same manner as in Example 1 except that, the diameter of each of the small holes formed in the PET film was set to 4 mm.

Example 4

A polarizing plate including a polarizer having transparent portions was obtained in the same manner as in Example 2 except that the diameter of each of the small holes formed in the PET film was set to 4 mm.

The transmittance, iodine content, and sodium content of each of the transparent portions of the polarizers formed in Examples and Comparative Examples were measured by the following methods.

1. Transmittance (Ts)

Measurement was performed with a spectrophotometer (manufactured by Murakami Color Research Laboratory, product name: "DOT-3"). A transmittance (T) is a Y value subjected to visibility correction with the two-degree field of view (C light source) of JIS Z 8701-1982.

2. Iodine Content

An iodine content in each of the transparent, portions of a polarizer was determined by X-ray fluorescence analysis. Specifically, the iodine content of the polarizer was determined from a calibration carve produced in advance from an X-ray intensity measured under the following conditions through the use of a standard sample.

analysis apparatus: manufactured by Rigaku Corporation, X-ray fluorescence (XRF) analysis apparatus, product name "ZSX100e"
Anticathode: rhodium
Dispersive crystal: lithium fluoride
Excitation light energy: 40 kV-90 mA
Iodine measured line: I-LA
Quantification method: FP method
2θangle peak: 103.078 deg (iodine)
Measurement time: 40 seconds 3. Sodium Content A sodium content in each of the transparent portions of a polarizer was determined by X-ray fluorescence analysis. Specifically, the sodium content of the polarizer was determined from a calibration curve produced in advance from an X-ray intensity measured under the following conditions through the use of a standard sample.

Analysis apparatus: manufactured by Rigaku Corporation, X-ray fluorescence (XRF) analysis apparatus, product name "ZSX100e"
Anticathode: rhodium
Dispersive crystal: lithium fluoride
Excitation light energy: 40 kV-90 mA
Sodium measured line Na-KA
Quantification method: FP method
Measurement time: 40 seconds Each of the transparent portions of the polarizers obtained in Examples and Comparative Examples had a transmittance of 90% or more, an iodine content of less than 1 wt %, and a sodium content of less than 0.5 wt %. Those transparent portions were able to function as non-polarization portions.

In addition, the shape matching degree of each of the transparent portions formed in the respective polarizers was evaluated as described below.

[Shape Matching Degree]

The edge detection of each of the non-polarization portions of the polarizers obtained in Examples 1 to 4 and Comparative Examples 1 to 3 was performed with an ultrahigh-speed flexible image processing system (manufactured by Keyence Corporation, product name: XG-7700) to determine a non-polarization portion approximate circle. A distance between the circumference of the non-polarization portion approximate circle (broken line portion in each of FIG. 2A and FIG. 2B), and a boundary between the polarizer 1 and the non-polarization portion 2 (solid line portion in each of FIG. 2A and FIG. 2B) was measured every 2°, and the distances were determined at a total of 180 points. In the case where the boundary between the polarizer 1 and the non-polarization portion 2 was positioned outside the non-polarization portion approximate circle at a measurement point, (i.e., in the case of FIG. 2A), the distance a between the non-polarization portion 2 and the non-polarization portion approximate circle was measured, and in the case where the boundary between the polarizer 1 and the non-polarization portion 2 was positioned inside the non-polarization portion approximate circle at the point (i.e., in the case of FIG. 2B), the distance b between the non-polarization portion 2 and the non-polarization portion approximate circle was measured. The total value of the maximum value of the distance a and the maximum value of the distance b was calculated as hole roughness. A value for the shape matching degree of each of the transparent, portions was determined by dividing the calculated hole roughness value by the diameter of each of the small holes formed in the PET film (Examples 1 and 2 and Comparative Examples 1 to 3:2 mm, Examples 3 and 4:4 mm). The average of the shape matching degrees of the transparent portions formed on each of the polarizers is shown in Table 1.

TABLE 1

|  | Size of through-hole | Shape matching degree |
|---|---|---|
| Example 1 | 2 mm | 0.05 |
| Example 2 |  | 0.025 |
| Comparative Example 1 |  | 0.075 |
| Comparative Example 2 |  | 0.075 |
| Comparative Example 3 |  | 0.075 |
| Example 3 | 4 mm | 0.047 |
| Example 4 |  | 0.025 |

The polarizer of each of Examples 1 to 4 had a shape matching degree of 0.05 or less, and hence a polarizer having non-polarization portions corresponding to the shapes of the small holes formed in the PET film was obtained. For example, when a polarizer having such non-polarization portions is used so that the non-polarization portions may each correspond to a camera portion of an image display apparatus, alignment processability is improved and hence the alignment of the camera can be satisfactorily per formed.

INDUSTRIAL APPLICABILITY

The polarizer of the present invention is suitably used in an image display apparatus (a liquid crystal display apparatus or an organic EL device) with a camera of, for example, a cellular phone, such as a smart phone, a notebook PC, or a tablet PC.

REFERENCE SIGNS LIST 10 polarizer
20 protective film
30 surface protective film
50 surface protective film
60 pressure-sensitive adhesive layer
51 exposed portion
71 through-hole
100 polarizing film laminate

The invention claimed is:

1. A polarizer, comprising a polarization portion and a non-polarization portion, wherein the non-polarization portion has a shape matching degree of 0.05 or less and 0.025 or more, where the shape matching degree is an indicator representing a degree of unevenness of a shape of the formed non-polarization portion in its radial direction with respect to an outer periphery of a designed non-polarization portion,
the non-polarization portion has a content of an alkali metal and/or an alkaline earth metal of 3.6 wt % or less, and
the polarizer comprises boric acid, a content of the boric acid in the polarization portion is 10 wt % to 30 wt %, the non-polarization portion having a reduced content of boric acid of 5 wt % to 12 wt %.

2. The polarizer according to claim 1, wherein the non-polarization portion has a dichromatic substance content of 1.0 wt % or less.

3. A polarizing plate, comprising the polarizer of claim 2, and a protective film.

4. A polarizing plate, comprising the polarizer of claim 1, and a protective film.

5. An image display apparatus, comprising the polarizing plate of claim 4, and a liquid display apparatus or an organic EL device.

6. The polarizer according to claim 1, wherein the non-polarizing portion is produced by a method comprising the steps of:
(i) forming a laminate comprising a surface protective film laminated on to a surface of the polarizer through a pressure-sensitive adhesive layer, the surface protective film having at least one through-hole exposing a portion of the polarizer;
(ii) bringing a basic solution into contact with the exposed portion to form the non-polarization portion;
(iii) bringing a treatment liquid into contact with the non-polarization portion; and
(iv) a step of removing the basic solution and treatment liquid from the non-polarization portion.

7. The polarizer according to claim 6, wherein the treatment liquid is selected from the group consisting of solvent water, ethanol, methanol, ethers, benzene, chloroform, and mixtures thereof.

8. The polarizer according to claim 6, wherein the treatment liquid is an acidic compound selected from the group consisting of hydrochloric acid, sulfuric acid, nitric acid, hydrogen fluoride, boric acid, formic acid, oxalic acid, citric acid, acetic acid, and benzoic acid.

9. The polarizer according to claim 6, wherein the removing step including wiping, suction removal, natural drying, heat drying, blow drying, or drying under reduced pressure.

10. The polarizer according to claim 6, wherein the thickness of the pressure-sensitive adhesive layer is 10 μm or less.

11. The polarizer according to claim 6, wherein the basic solution is selected from the group consisting of sodium hydroxide, potassium hydroxide, lithium hydroxide, calcium hydroxide, sodium carbonate, sodium acetate, and ammonia water.

* * * * *